United States Patent

Tholander et al.

(10) Patent No.: US 6,481,770 B2
(45) Date of Patent: Nov. 19, 2002

(54) GRIPPING DEVICE

(75) Inventors: Mats Tholander, Örebro (SE); Conny Nordin, Askersund (SE); Kaj Eriksson, Kumla (SE); Daniel Hultman, Örebro (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/769,722

(22) Filed: Jan. 25, 2001

(65) Prior Publication Data

US 2001/0040381 A1 Nov. 15, 2001

(30) Foreign Application Priority Data

Jan. 26, 2000 (EP) ............................................ 00610011

(51) Int. Cl.[7] ................................................ B25J 15/12
(52) U.S. Cl. ......................... 294/100; 294/88; 294/116; 901/37
(58) Field of Search ............................... 294/88, 94, 95, 294/99.1, 100, 102.1, 103.1, 104, 115, 116, 86.4; 29/729, 741, 758; 901/36–39

(56) References Cited

U.S. PATENT DOCUMENTS

| | | | | |
|---|---|---|---|---|
| 2,215,844 A | * | 9/1940 | Van Syckle | 294/115 X |
| 2,899,232 A | * | 8/1959 | Walter | 294/116 X |
| 3,108,835 A | * | 10/1963 | Rowekamp | 294/116 X |
| 3,625,378 A | * | 12/1971 | Attiz | 294/100 X |
| 3,630,391 A | * | 12/1971 | Wilson | 294/116 X |
| 4,045,870 A | | 9/1977 | Scott | 29/741 |
| 4,179,803 A | | 12/1979 | Wolkert | 29/741 |
| 4,257,639 A | * | 3/1981 | Stock | 294/100 X |
| 5,263,753 A | * | 11/1993 | Breu et al. | 294/99.1 |
| 5,383,697 A | * | 1/1995 | Roudaut | 294/115 X |
| 5,458,388 A | | 10/1995 | Danek et al. | 294/100 |
| 5,503,446 A | * | 4/1996 | De Jong | 294/100 X |
| 5,895,084 A | | 4/1999 | Mauro | 294/100 |
| 5,938,258 A | * | 8/1999 | Femling | 294/116 X |

FOREIGN PATENT DOCUMENTS

| | | | | |
|---|---|---|---|---|
| DE | 3011837 | * | 10/1981 | 294/100 |
| DE | 19637618 | | 3/1998 | |
| DE | 19644502 | | 5/1998 | |
| GB | 1200141 | * | 7/1970 | 294/100 |
| NO | 84040732 A | | 5/1985 | |
| SU | 1572808 | * | 6/1990 | 294/100 |

* cited by examiner

Primary Examiner—Johnny D. Cherry
(74) Attorney, Agent, or Firm—Jenkens & Gilchrist, P.C.

(57) ABSTRACT

A gripping device for a component mounting machine, the gripping device comprising a gripping device body (1) with a finger portion (2). The finger portion (2) is provided with at least two elongate fingers (3, 4) made in one piece, each finger (3, 4) having an outer edge (5, 6), the outer edges (5, 6) being provided for, in cooperation, gripping a component. The at least two fingers (3, 4) are flexible in relation to each other so that the outer edges (5, 6) of the fingers (3, 4) are moveable towards and away from each other. Movement of at least one finger (4) is controlled by a slide (7) engaging a part of the finger portion (2) remote from the finger (4) for positive movement of the finger (4) in different directions, the slide (7) being displaceably mounted on the gripping device body (1).

8 Claims, 1 Drawing Sheet

GRIPPING DEVICE

Figure 1:
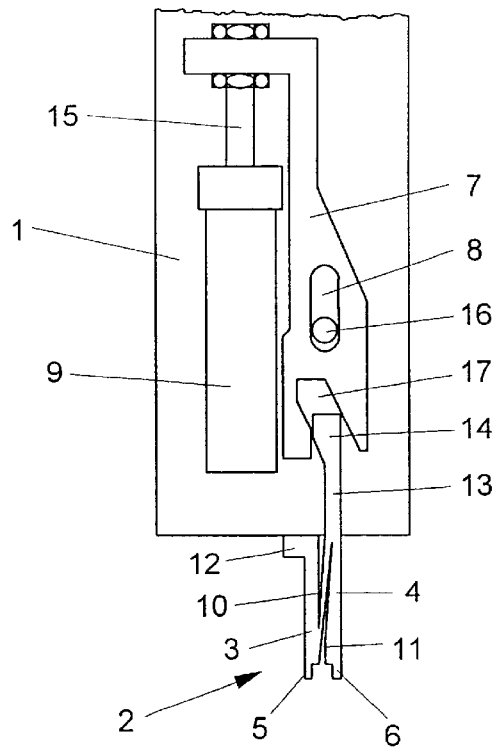

The invention relates to a gripping device for a component mounting machine, said gripping device comprising a gripping device body with a finger portion, said finger portion being provided with at least two elongate fingers made in one piece, each finger having an outer edge, said outer edges being provided for, in cooperation, gripping a component, said at least two fingers being flexible in relation to each other so that the outer edges of the fingers are movable towards and away from each other.

NO-B-167 366 shows a gripping device of this type in which two gripping fingers made in one piece extend parallel with each other. One of the fingers has a portion with two thin, parallel walls thereby making it elastically deformable. When a lateral pressure is applied directly on the finger, it is moved towards the other finger.

DE-A1-196 44 502 shows a gripping device comprising fingers which are made integrally with the body of the gripper. Each finger is connected to the body of the gripping device via a narrow bridge forming a relatively rigid hinge. The inner end of each finger is provided with a lever and a disc is arranged for pressing the levers thereby causing the fingers to tilt about their relatively rigid hinges.

U.S. Pat. No. 5,458,388 shows a gripping device comprising a vacuum chamber provided with a piston that is retracted when a vacuum is applied. The piston presses on levers connected to gripping fingers which are moved towards each other by tilting about hinge portions of the fingers.

The above-mentioned devices are characterised in that the gripping fingers are made in one piece and that a force is applied for forcing the fingers towards each other. The fingers are deformed elastically and the inherent elasticity of the finger material causes the fingers to be moved away from each other once the applied force is removed again.

When gripping and mounting very small components, there is a need for accurately controlling the fingers that grip the components. The known gripping devices may be accurate in their gripping action, but when the components are to be released by removal of the applied force that forces the fingers towards each other, the movement of the fingers are totally dependent on the inherent elasticity of the finger material. This may—especially over time—cause inaccurate and unforseeable positions of the fingers which is most undesirable in precision machine works.

The object of the invention is to provide a gripper that overcomes this problem.

This is achieved by arranging the gripper device so that movement of at least one finger is controlled by a slide engaging a part of the finger portion remote from said finger for positive movement of said finger in different directions, said slide being displaceably mounted on the gripping device body.

The term "positive movement" when used in this specification is meant to mean movement in either direction directly and unambiguously controlled by a positive engagement between the slide and the finger portion.

Thereby, the movements of the gripper fingers are controlled and forseeable at all times during the gripping and releasing procedures.

Preferably, the finger portion is made in one piece with the gripping device body thereby reducing the number of separate parts in the gripping device. This facilitates assembling of the gripping device and furthermore eliminates any play and requirements to manufacturing tolerances between the otherwise two parts.

In a preferred embodiment the slide is provided with a notch that cooperates with a guiding knob provided on the finger portion. When the slide is displaced, the guiding knob is displaced accordingly causing the fingers of the finger portion to be displaced towards or away from each other.

Preferably, the finger portion is provided with two fingers, one of said fingers being in substantially rigid relation to the gripping device body, the other being flexible in relation to the gripping device body. The flexibility may be achieved by providing a narrow tongue interconnecting the two fingers, and in a preferred embodiment the tongue extends substantially parallel with a longitudinal direction of the fingers and is connected to one finger at a first end thereof and to the other finger at a second end thereof. This structure results in a slim design of the finger portion, while maintaining its high flexibility. It is therefore especially suitable for mounting of small components even in narrow places.

A pneumatic actuator may be provided for displacing the slide in relation to the gripping device body thereby making it suitable for any kind of mounting machine where compressed air is available. However, other types of actuators may be applied, e.g. electric motors.

In order to control the movement of the slide a guideway may be provided in the slide, said guideway being able to cooperate with a guiding pin provided on the gripping device body.

Figure 2:
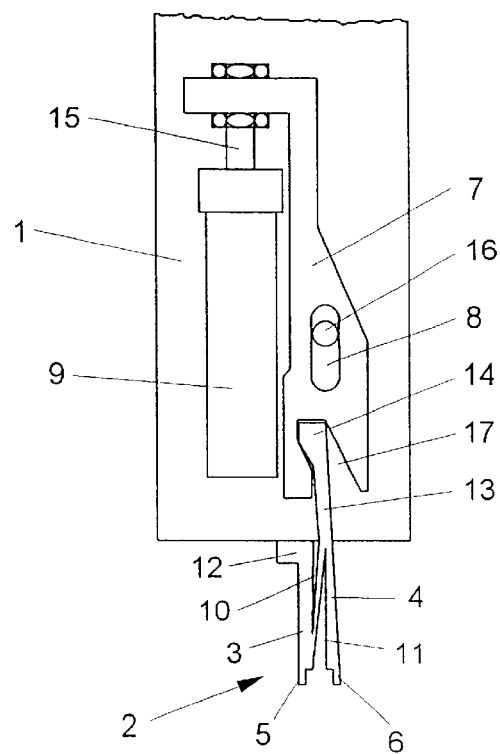

The invention will be described in detail in the following with reference to the drawings in which FIG. 1 shows a first embodiment of a gripping device according to the invention in a closed position, FIG. 2 shows the device of FIG. 1 in an opened position.

The gripping device according to the invention shown in FIGS. 1 and 2 comprises a gripping device body 1 with a finger portion 2 provided with two fingers 3, 4 each having an outer edge 5, 6, a slide 7 having a guideway 8 and a pneumatic actuator 9.

The gripping device is mountable in a component mounting machine, such as a robot mounting cell or the like.

The gripping device is shown in its closed position in FIG. 1, i.e. the gap between the outer edges 5, 6 is as small as possible. This gap is shaped in accordance with the component that is to be handled by the gripping device.

In addition to the two fingers 3, 4, the finger portion 2 comprises two slots 10, 11, a bridging portion 12 and an elongated finger part 13 having a guiding knop 14 at its upper end. The finger portion 2 is made of the same piece as the gripping device body 1; hence, they are in rigid relation via the bridging portion 12. The rest of the finger portion 2 is positioned in front of the gripping device body 1.

It should be noticed, however, that the finger portion 2 may be made as a separate part that is fastened to the gripping device body 1, e.g. by bolts extending through a backwards extending part of the bridging portion 12.

The two slots 10, 11 give the finger portion 2 some flexibility allowing the outer edges 5, 6 of the fingers 3, 4 to be moved towards and away from each other in order to grip and release a component. The movement of the fingers 3, 4 is preferably such that only elastic deformation of the finger portion 2 occurs.

A slide 7 cooperating with the guiding knob 14 of the finger portion 2 is positioned on the front of the gripping device body 1. The slide 7 is movable in the vertical direction via the pneumatic actuator 9, the housing of which is firmly connected to the gripping device body 1 and the piston 15 being connected to the upper end of the slide 7. The movement is determined by the vertical movement of the piston 15 and the cooperation of the guideway 8 provided in the slide 7 with a guiding pin 16 connected to the gripper device body 1.

The lower end of the slide 7 is provided with a notch 17 that cooperates with the guiding knob 14 of the finger portion 2. The notch 17 is provided with inclined side faces which force the guiding knob 14 to move laterally when the slide 7 is displaced vertically. The lateral displacement of the guiding knob 14 causes the outer edge 6 of the finger 4 to be laterally displaced as well, thereby opening or closing the gap between the outer edges 5, 6 of the fingers 3, 4.

The play between the side faces of the notch 17 and the guiding knob 14 of the finger portion 2 is reduced to a minimum in order to ensure that the position of the guiding knob 14—and thereby the outer edge 6 of the finger 4—is determinable at all times dependent only on the position of the slide 7.

In FIG. 2 the slide 7 has been displaced downwards by means of the pneumatic actuator 9. Due to the shape of the notch 17 and the interaction between the notch 17 and the guiding knob 14, the latter is forced to the left as shown. Since the finger portion 2 is flexible, the outer edge 6 of the finger 4 is displaced to the right as shown, thereby opening the gap between the outer edges 5, 6 of the fingers 3, 4. In this position the gripper device is ready for gripping a component.

When a component has been positioned between the outer edges 5, 6 of the fingers 3, 4, the pneumatic actuator 9 is activated and causes the slide 7 to be displaced upwards. This forces the guiding knob 14 to the right which in turn closes the gap between the outer edges 5, 6 of the fingers 3, 4 thereby gripping the component.

When the component has been transferred to the desired position, the slide 7 is displaced downwards again which opens the gap between the outer edges 5, 6 of the fingers 3, 4 and thereby releases the component. The gripper device is then ready for gripping another component.

The drawings show a gripper device according to the invention in a preferred embodiment. However, many modifications can be made without departing from the general concept of the invention.

Apart from the general concept of the invention, emphasis should be put on the geometry of the finger portion 2 as well as the slide 7. For instance, by varying the shape of the guiding knob 14 of the finger portion 2 and the corresponding notch 17 of the slide 7, it is possible to define different movement patterns of the outer edges 5, 6 of the fingers 3, 4 adapted for specific purposes. If required, the outer edges 5, 6 of the fingers 3, 4 could be adapted to grip cylinders or other components from the inside by providing a suitable geometry to the finger portion and the slide.

Also, the slide could be horizontally displaceable instead of vertically displaceable if it is required to limit the height of the gripper device, e.g. due to limited free space above the gripper device.

The flexibility of the finger portion could also be achieved by shaping the elastical part differently. It is, however, important that the finger portion is made in one piece thereby avoiding the high requirements to acceptable manufacturing tolerances that would have been necessary had the finger portion consisted of more pieces.

It should be emphasized that the term "comprises/ comprising" when used in this specification is taken to specify the presence of stated features, integers, steps or components, but does not preclude the presence or addition of one or more other features, integers, steps components or groups thereof.

What is claimed is:

1. A gripping device for a component mounting machine, said gripping device comprising a gripping device body with a finger portion, said finger portion being provided with at least two elongate fingers made in one piece, each finger having an outer edge, said outer edges being provided for, in cooperation, gripping a component, said at least two fingers being flexible in relation to each other so that the outer edges of the fingers are moveable towards and away from each other, wherein movement of at least one finger is controlled by a slide engaging a part of the finger portion remote from said finger for positive movement of said finger in different directions, said slide being displaceably mounted on the gripping device body.

2. A gripping device according to claim 1, wherein said finger portion is made in one piece with the gripping device body.

3. A gripping device according to claims 1 or 2, wherein the slide is provided with a notch that cooperates with a guiding knob provided on the finger portion.

4. A gripping device according to any one of claims 1-2, wherein the finger portion is provided with two fingers, one of said fingers being in substantially rigid relation to the gripping device body, the other being flexible in relation to the gripping device body.

5. A gripping device according to claim 1, wherein the two fingers are interconnected via a narrow tongue.

6. A gripping device according to claim 5, wherein said tongue extends substantially parallel with a longitudinal direction of the fingers and that said tongue is connected to one finger at a first end thereof and to the other finger at a second end thereof.

7. A gripping device according to claim 1, wherein a pneumatic actuator is provided for displacing the slide in relation to the gripping device body.

8. A gripping device according to claim 1, wherein a guideway is provided in the slide, said guideway being able to cooperate with a guiding pin provided on the gripping device body for controlling the displacement of the slide.

* * * * *

UNITED STATES PATENT AND TRADEMARK OFFICE
CERTIFICATE OF CORRECTION

PATENT NO.    : 6,481,770 B2
DATED         : November 19, 2002
INVENTOR(S)   : Mårten Rignell et al.

It is certified that error appears in the above-identified patent and that said Letters Patent is hereby corrected as shown below:

<u>Title page,</u>
Item [30], delete "00610011" and replace with -- 00610011.9 --

Signed and Sealed this

Fifth Day of August, 2003

JAMES E. ROGAN
*Director of the United States Patent and Trademark Office*